United States Patent
Dashevsky et al.

(10) Patent No.: US 9,932,809 B2
(45) Date of Patent: Apr. 3, 2018

(54) METHOD AND APPARATUS FOR HYDRAULIC FRACTURE GEOMETRY EVALUATION

(71) Applicants: Yuliy A. Dashevsky, Novosibirsk (RU); Alexandr N. Vasilevskiy, Novosibirsk (RU); Gleb V. Dyatlov, Novosibirsk (RU); Igor N. Eltsov, Novosibirsk (RU); Alexander I. Makarov, Novosibirsk (RU)

(72) Inventors: Yuliy A. Dashevsky, Novosibirsk (RU); Alexandr N. Vasilevskiy, Novosibirsk (RU); Gleb V. Dyatlov, Novosibirsk (RU); Igor N. Eltsov, Novosibirsk (RU); Alexander I. Makarov, Novosibirsk (RU)

(73) Assignee: Baker Hughes Incorporated, Houston, TX (US)

( * ) Notice: Subject to any disclaimer, the term of this patent is extended or adjusted under 35 U.S.C. 154(b) by 867 days.

(21) Appl. No.: 14/200,084

(22) Filed: Mar. 7, 2014

(65) Prior Publication Data
US 2015/0252668 A1    Sep. 10, 2015

(51) Int. Cl.
*E21B 43/26*    (2006.01)
*G01V 3/08*    (2006.01)

(52) U.S. Cl.
CPC .............. *E21B 43/26* (2013.01); *G01V 3/08* (2013.01)

(58) Field of Classification Search
CPC .......... E21B 43/26; G01V 3/08; G01R 33/005
See application file for complete search history.

(56) References Cited

U.S. PATENT DOCUMENTS

| | | | |
|---|---|---|---|
| 5,434,507 A * | 7/1995 | Beren | G01V 3/30 324/338 |
| 6,116,342 A | 9/2000 | Clark et al. | |
| 7,082,993 B2 * | 8/2006 | Ayoub | E21B 43/26 166/250.1 |
| 7,819,181 B2 * | 10/2010 | Entov | E21B 43/26 324/353 |
| 8,168,570 B2 * | 5/2012 | Barron | E21B 43/267 428/357 |
| 8,688,423 B2 * | 4/2014 | Jessop | G01V 3/02 703/9 |
| 8,773,132 B2 * | 7/2014 | Eick | G01V 3/265 324/324 |
| 8,931,553 B2 * | 1/2015 | Cannan | E21B 43/26 166/250.01 |
| 2009/0179649 A1 | 7/2009 | Schmidt et al. | |
| 2010/0038083 A1 | 2/2010 | Bicerano | |

(Continued)

OTHER PUBLICATIONS

R.P. Fitz-Patrick, G.K. Karr, and P.A. O'Shea, "A Comprehensive Fracture Diagnostics Experiment: Part 1—An Overview," SPE Production Engineering, Nov. 1986, pp. 411-422.

(Continued)

*Primary Examiner* — Jay B Hann
(74) *Attorney, Agent, or Firm* — Hirsch & Westheimer, PC

(57) ABSTRACT

A method of hydraulic fracturing geometry evaluation, comprising injecting a fracturing fluid comprising a magnetic material into a fracture, measuring a field affected by the fracturing fluid in the fracture, and modeling, based on the measuring, a geometry of the fracture.

17 Claims, 12 Drawing Sheets

(56) References Cited

U.S. PATENT DOCUMENTS

2015/0083404 A1* 3/2015 Wilt .................. E21B 47/0905
 703/10
2015/0253459 A1* 9/2015 Aldridge .................. G01V 3/30
 702/7

OTHER PUBLICATIONS

M.B. Smith, N.-K. Ren, G.G. Sorrells, and L.W. Teufel, "A Comprehensive Fracture Diagnostics Experiment: Part 2—Comparison of Fracture Azimuth Measuring Procedures," SPE Production Engineering, Nov. 1986, pp. 423-431.

V. Colvin and C. Avendano, "Magnetic characterization of nanoparticles designed for use as contrast agents for downhole measurements," Advanced Energy Consortium, Apr. 28, 2011, thirty-two pages.

N.E. Goldstein, "Fracture Detection and Characterization for Geothermal Reservoir Definition," presented at the 10th Annual Workshop on Geothermal Reservoir Engineering, Stanford University, Stanford, CA, Jan. 22-24, 1985, sixteen pages.

Q. Chen and Z. J. Zhang, "Size-dependent superparamagnetic properties of MgFe2O4 spinel ferrite nanocrystallites," Applied Physics Letters, Nov. 23, 1998, pp. 3156-3158, vol. 73, No. 21, American Institute of Physics.

N. Salies, M.M. Sharma and H. Ling "Project F11: Fracture diagnostics using EM methods," University of Texas, Fracturing and Sand Control JIP, 2011 Annual Meeting, Apr. 25, 2011, thirty pages.

G.E. King, "Thirty Years of Gas Shale Fracturing: What Have We Learned?" (SPE 133456), presented at SPE Annual Technical Conference and Exhibition, Florence, Italy, Sep. 19-22, 2010, pp. 1-50.

A. G. Roca, S. Veintemillas-Verdaguer, M. Port, C. Robic, C.J. Serna, and M.P. Morales, "Effect of Nanoparticle and Aggregate Size on the Relaxometric Properties of MR Contrast Agents Based on High Quality Magnetite Nanoparticles," J. Phys. Chem. B, 2009, pp. 7033-7039, vol. 113, No. 19, American Chemical Society.

\* cited by examiner

| Material | Thickness (μm) | $B_s$ (T) | $B_r/B_s$ (%) | $H_c$ (A/m) | $\mu_{r(1kHz)}$ (×10³) | $\mu_{r(100kHz)}$ (×10³) | $P_{cv}$ (kW/m³) | $\lambda_s$ (×10⁻⁶) | $T_c$ (°C) |
|---|---|---|---|---|---|---|---|---|---|
| FINEMET FT-1H | 18 | 1.35 | 90 | 0.8 | 5.0 | 1.5 | 950 | +2.3 | ~570 |
| FINEMET FT-1M | | 1.35 | 60 | 1.3 | 70.0 | 15.0 | 350 | | |
| FINEMET FT-3H | | 1.23 | 89 | 0.6 | 30.0 | 5.0 | 600 | | |
| FINEMET FT-3M | 18 | 1.23 | 50 | 2.5 | 70.0 | 15.0 | 300 | ≈0 | ~570 |
| FINEMET FT-3L | | 1.23 | 5 | 0.6 | 50.0 | 16.0 | 250 | | |
| Fe based amorphous | 25 | 1.56 | 83 | 2.4 | 5.0 | 5.0 | 2200 | +27 | 415 |
| Co-based high permeability amorphous metal | 18 | 0.55 | 5 | 0.3 | 115.0 | 18.0 | 280 | ≈0 | 180 |
| Co-based high squareness amorphous metal | 18 | 0.60 | 85 | 0.3 | 30.0 | 10.0 | 460 | ≈0 | 210 |
| 3%Si-steel | 50 | 1.90 | 85 | 6.0 | 2.7 | 0.8 | 8400 | -0.8 | 750 |
| 6.5%Si-steel | 50 | 1.30 | 63 | 45.0 | 1.2 | 0.8 | 5800 | -0.1 | 700 |
| 50% Ni Permalloy | 25 | 1.50 | 95 | 12.0 | — | — | 3400 | +25 | 500 |
| 80% Ni high permeability Permalloy | 25 | 0.74 | 55 | 0.5 | 50.0 | 5.0 | 1000 | ≈0 | 460 |
| 80% Ni high squareness Permalloy | 25 | 0.74 | 80 | 2.4 | — | — | 1200 | ≈0 | 460 |
| Mn-Zn high permeability ferrite | — | 0.44 | 23 | 8.0 | 5.3 | 5.3 | 1200 | -0.6 | >150 |
| Mn-Zn low core loss ferrite | — | 0.49 | 29 | 12.0 | 2.4 | 2.4 | 680 | -0.6 | >200 |

- 210 — Dispose apparatus for measurement of the electric and magnetic fields in boreholes

- 220 — Perform time-lapse measurements of the electric and magnetic fields in boreholes before, during, and after fracturing.

- 230 — Process the electric and magnetic measurement data to estimate the fracture wing length.

FIG. 10

METHOD AND APPARATUS FOR HYDRAULIC FRACTURE GEOMETRY EVALUATION

CROSS-REFERENCE TO RELATED APPLICATIONS

None

STATEMENT REGARDING FEDERALLY SPONSORED RESEARCH

None

TECHNICAL FIELD OF THE INVENTION

The present disclosure relates generally to systems, methods, and apparatuses for hydraulic fracture geometry evaluation. More particularly, the disclosure relates to systems, methods and apparatuses for the use of time-lapse measurement of electrical and magnetic fields in boreholes to determine hydraulic fracture geometry.

BACKGROUND

Hydraulic fracturing is a method of enhancing hydrocarbon production. Hydraulic fracturing is particularly effective in improving the productivity of hydrocarbon reservoirs with low permeability. A non-limiting example of a hydrocarbon formation with low permeability is natural gas from shale beds or other "tight gas" formations. Hydraulic fracturing is also commonly referred to as a "fracture" or "fracturing."

Hydraulic fracturing treatment operations are typically employed in vertical, deviated and horizontal wells. In a typical hydraulic fracturing operation, the wellbore, also known as a borehole, to be treated or stimulated is drilled through the formation to where the hydraulic fracturing treatment will take place.

Typically, as the well is drilled, it is lined with several layers of steel casing that are anchored to the wellbore with cement. The casing is designed to isolate the borehole, also known as a wellbore, from the surrounding rock. The casing also serves the purpose of preventing fluids in the rocks from entering the wellbore, as well as preventing or mitigating fluids from the formation escaping which can potentially contaminate the area around the wellbore. After the wellbore of interest is drilled, perforating guns are used to "perf" (also referred to as "perforate") the casing to allow hydraulic fracturing fluid to fracture the formation surrounding the wellbore. A typical example of a cased and perforated wellbore is illustrated in FIGS. 1A 1B and 1C.

At its most basic, hydraulic fracturing is a well stimulation technique to increase productivity of a well by creating highly conductive fractures or channels into the formation surrounding the wellbore. This process normally involves two steps: (1) injecting a fluid at a sufficient rate to pressure the formation to rupture, thereby creating a crack (fracture) in the reservoir rock and (2) placing a propping agent (proppant) to maintain the fracture after the pressure is released or reduced. The goal of hydraulic fracturing is to create a dendritic (branching) pattern of open channels for hydrocarbons in the reservoir to begin flowing into the wellbore. Thus, it would be desirable to determine if such channels have been formed and also the geometry of the channels.

The geometry of a hydraulic fracture affects the success of the fracturing operation. As such, a variety of techniques have been used to attempt to determine fracture geometry. For example, passive seismic methods, also known as hydraulic fracture visualization, have been used to attempt to evaluate the spatial orientation of a fracture and its length. This process has some intrinsic uncertainty because the scatter of natural seismic events can be large compared to the width of the typical fracture. These passive seismic methods are also of limited value because they require a second well for observation, located within a reasonably small distance from the well that is being stimulated (fractured). Unless the observation well is already present, the cost and time delay of drilling the observation well can be prohibitive. Active seismic sources have also been used in an attempt to determine fracture geometry. It has been found that active seismic sources are not efficient because the returned seismic signal will have a small amplitude which can be difficult to detect as the measured fracture is further below the earth's surface. Phrased differently, the signal from an active seismic source may attenuate before the signal can be detected if the fracture is not near the earth's surface. It has also been suggested that use of proppants coated in piezoelectric or magnetostrictive materials could be used to determine fracture geometry. Other authors have suggested that radioactive materials could be injected downhole and tracked as they flow into a fracture. However, if the radioactive materials fail to lodge in the fracture, this technique would be of limited value.

SUMMARY

In view of the aforementioned problems and trends, embodiments of the present invention provide systems, methods and apparatuses for hydraulic fracture geometry evaluation.

In accordance with some embodiments is a method of hydraulic fracturing geometry evaluation, comprising: inserting a fracture fluid comprising a magnetic material into a fracture; measuring a field affected by the fracture fluid in the fracture; and modeling, based on the measuring, a geometry of the fracture.

Another embodiment is an apparatus for hydraulic fracturing geometry evaluation, comprising: means for providing measurement of a field affected by a fracturing fluid, comprising a magnetic material, in a fracture; and means for modeling; based on the measurement, a geometry of the fracture.

Another embodiment is an apparatus for hydraulic fracturing geometry evaluation, comprising: at least one processor; a memory coupled to the at least one processor, the memory comprising executable instructions that, when executed, cause the at least one processor to: receive measurements of a field affected by a fracture fluid, comprising a magnetic material, in a fracture; and, model a geometry of the fracture based on the measurements.

Other aspects of the embodiments described herein will become apparent from the following description and the accompanying drawings, illustrating the principles of the embodiments by way of example only.

BRIEF DESCRIPTION OF THE DRAWINGS

The following figures form part of the present specification and are included to further demonstrate certain aspects of the present claimed subject matter, and should not be used to limit or define the present claimed subject matter. The present claimed subject matter may be better understood by reference to one or more of these drawings in combination with the description of embodiments presented herein. Consequently, a more complete understanding of the present embodiments and further features and advantages thereof may be acquired by referring to the following description taken in conjunction with the accompanying drawings, in which like reference numerals may identify like elements, wherein:

FIG. 4 is a table of the magnetic properties of various soft magnetic materials with a very high value of magnetic permeability;

FIG. 10 is a flow chart of a method of estimating fracture wing length; and,

NOTATION AND NOMENCLATURE

Figure 1A:
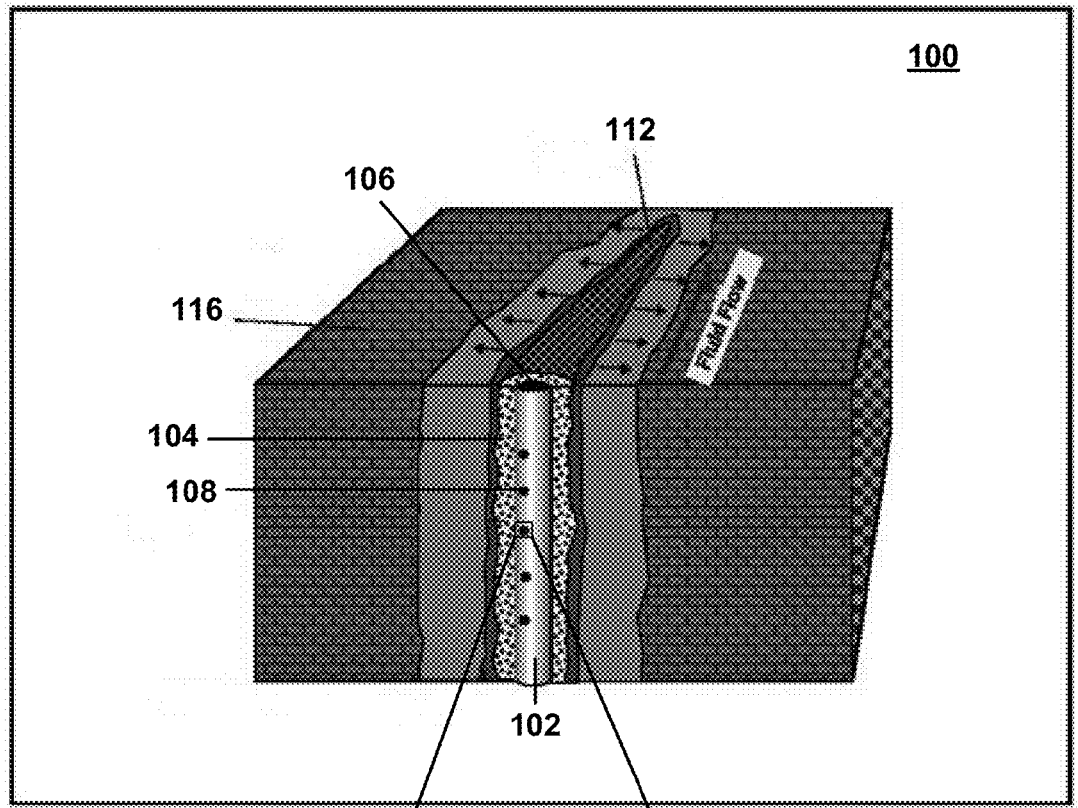
FIG. 1A is a schematic illustration of a reservoir undergoing hydraulic fracturing.

Certain terms are used throughout the following description and claims to refer to particular system components and configurations. As one skilled in the art will appreciate, the same component may be referred to by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The foregoing description of the figures is provided for the convenience of the reader. It should be understood, however, that the embodiments are not limited to the precise arrangements and configurations shown in the figures. Also, the figures are not necessarily drawn to scale, and certain features may be shown exaggerated in scale or in generalized or schematic form, in the interest of clarity and conciseness. The same or similar parts may be marked with the same or similar reference numerals.

While various embodiments are described herein, it should be appreciated that the present invention encompasses many inventive concepts that may be embodied in a wide variety of contexts. The following detailed description of exemplary embodiments, read in conjunction with the accompanying drawings, is merely illustrative and is not to be taken as limiting the scope of the invention, as it would be impossible or impractical to include all of the possible embodiments and contexts of the invention in this disclosure. Upon reading this disclosure, many alternative embodiments of the present invention will be apparent to persons of ordinary skill in the art. The scope of the invention is defined by the appended claims and equivalents thereof.

Illustrative embodiments of the invention are described below. In the interest of clarity, not all features of an actual implementation are described in this specification. In the development of any such actual embodiment, numerous implementation-specific decisions may need to be made to achieve the design-specific goals, which may vary from one implementation to another. It will be appreciated that such a development effort, while possibly complex and time-consuming, would nevertheless be a routine undertaking for persons of ordinary skill in the art having the benefit of this disclosure.

FIG. 1A illustrates a schematic of one wing of a bi-wing symmetrical fracture of a typical hydraulic fracturing 100. As noted above, as the well is drilled, it is lined with steel casing 102 that are anchored to the wellbore with cement 104. Casing 102 is designed to prevent the wellbore 106 from leaking pressure, drilling fluid or hydrocarbons into the surrounding rock or formation 116. Casing 102 also serves the purpose of preventing fluids in the rocks from entering the wellbore, as well as prevents or mitigates fluids from the formation 116 escaping, which can potentially contaminate the area around the wellbore 106. After the wellbore 106 of interest is drilled, perforation guns are used to "pert" (also referred to as "perforate") the casing 102 to allow hydraulic fracturing fluid to fracture formation 116 surrounding wellbore 106. Perforations 108 allow hydraulic fracturing fluid to flow under pressure and generate fractures or cracks in formation 116. In other words, perforations 108 permit fluid communication between the interior of casing 102 and the surrounding rock of formation 116.

Figure 1B:
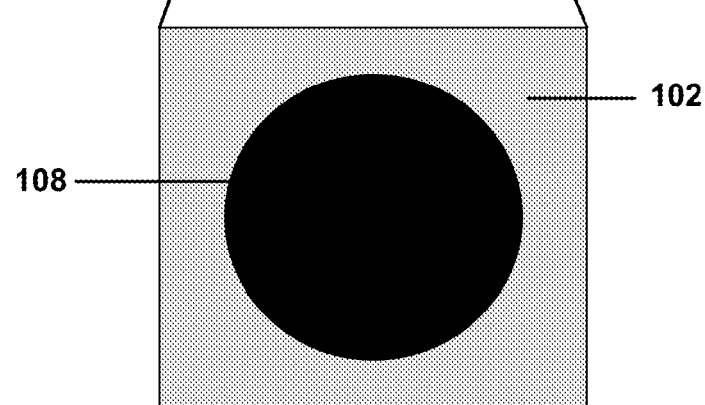
FIG. 1B is a partial view of a casing and a perforation illustrated in FIG. 1A.

FIG. 1B illustrates a partial view of the casing 102 and perforation 108 seen in FIG. 1A.

Figure 1C:
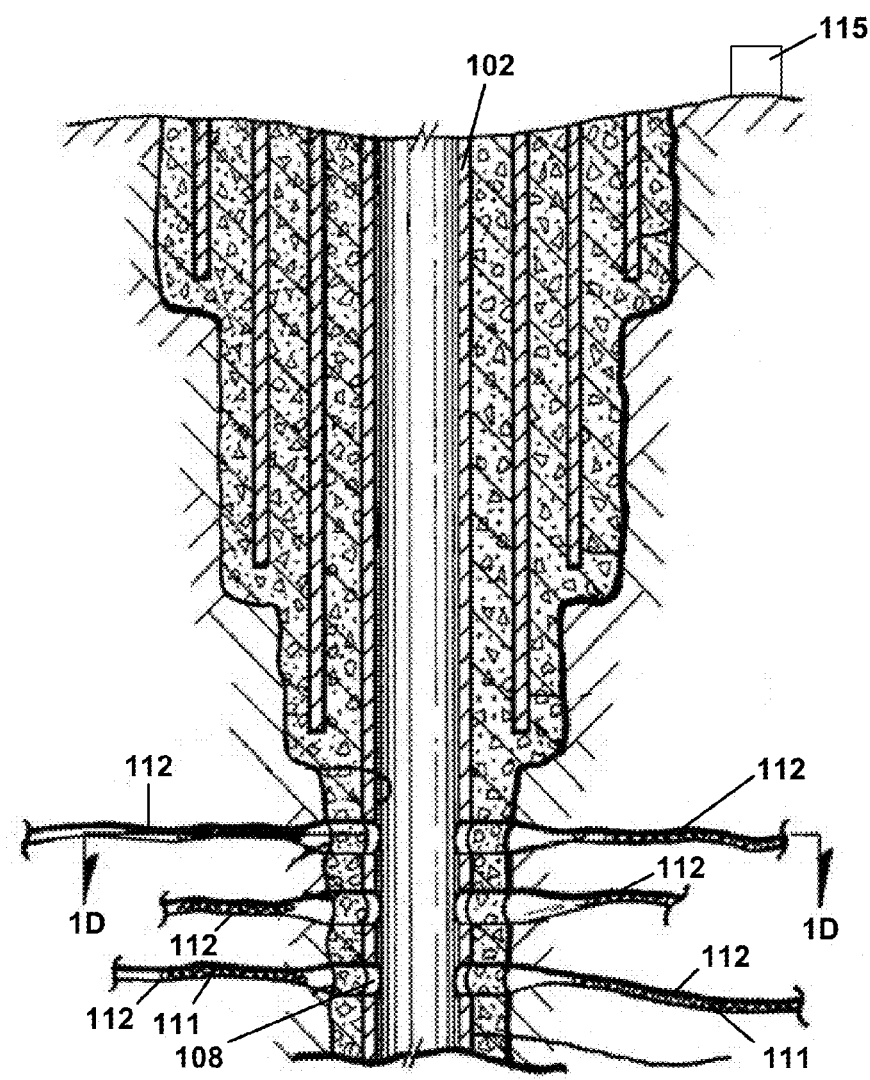
FIG. 1C is a cross-sectional view of an exemplary formation after hydraulic fracturing.

FIG. 1C is a cross-sectional view of an exemplary formation after hydraulic fracturing. Casing 102 has been perforated, typically by a perforating gun (not shown), and perforations 108 allow hydraulic fracturing fluid to open fractures 112 in formation 116. Fractures 112 thereby allow hydrocarbons from formation 116 to flow uphole to the surface through wellbore 106. As discussed above, proppant 111 may be lodged in fracture 112 to maximize fluid flow of hydrocarbons, such as oil and gas, to the surface. In accordance with some embodiments of the invention, as will be discussed below, proppant 111 should include particulates of a soft magnetic material with high magnetic permeability. Proppant 111, and particularly the particulates of soft magnetic material with high magnetic permeability, can be energized by a current source 115. In some embodiments, current source 115 may be a current electrode, a point electrode with current or a similar device. In some embodiments, current source 115 could be positioned on the surface, as illustrated in FIG. 1C, or could be positioned in borehole 106. Proppant 111 can be a soft magnetic material, ceramic beads containing a soft magnetic material or a combination of soft magnetic and ceramic beads in accordance with some embodiments. The use of ceramics may increase the strength of the proppant 111, which may be desirable to withstand closure stresses and hold fractures 112 open. Accordingly, proppant 111 may be formed from both ceramic bead materials and beads formed of soft magnetic materials or beads formed of a combination of ceramic and soft magnetic materials. In accordance with various embodiments, proppant 111 could be formed from any material that generates a magnetic and an electric field. During hydraulic fracturing, proppant 111 is conveyed into fractures 112 by a conducting fluid. In some embodiments, the conducting fluid is water. Conducting fluid, proppant and particulates of soft magnetic material with magnetic permeability may be mixed into a fracturing fluid. The fracturing fluid, when it is energized, generates electric and magnetic fields.

Figure 1D:
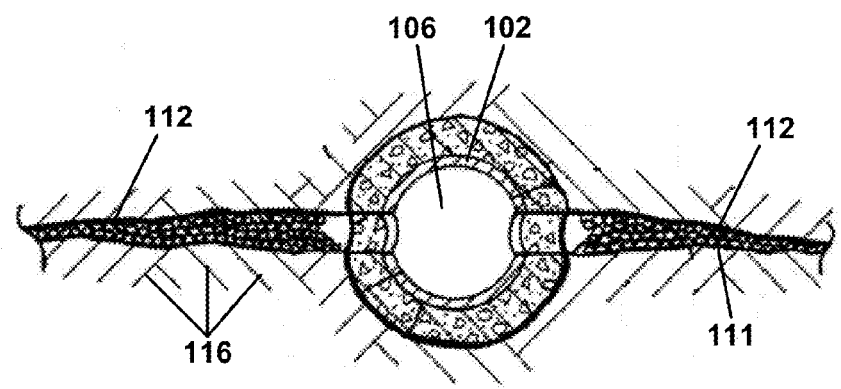
FIG. 1D is a cross-sectional view of the fracture illustrated in FIG. 1C taken along the lines 1D-1D of FIG. 1C.

FIG. 1D is a cross-sectional view of the fracture 112 illustrated in FIG. 1C, taken along the lines 1D-1D of FIG. 1C, and illustrates fractures 112 in formation 116. To allow maximum recovery of hydrocarbon deposits, it would be useful to know the geometry of fractures 112. However, because fractures 112 may be a great distance below the surface of the earth, it is not possible for a human to directly see fractures 112.

Figure 2:
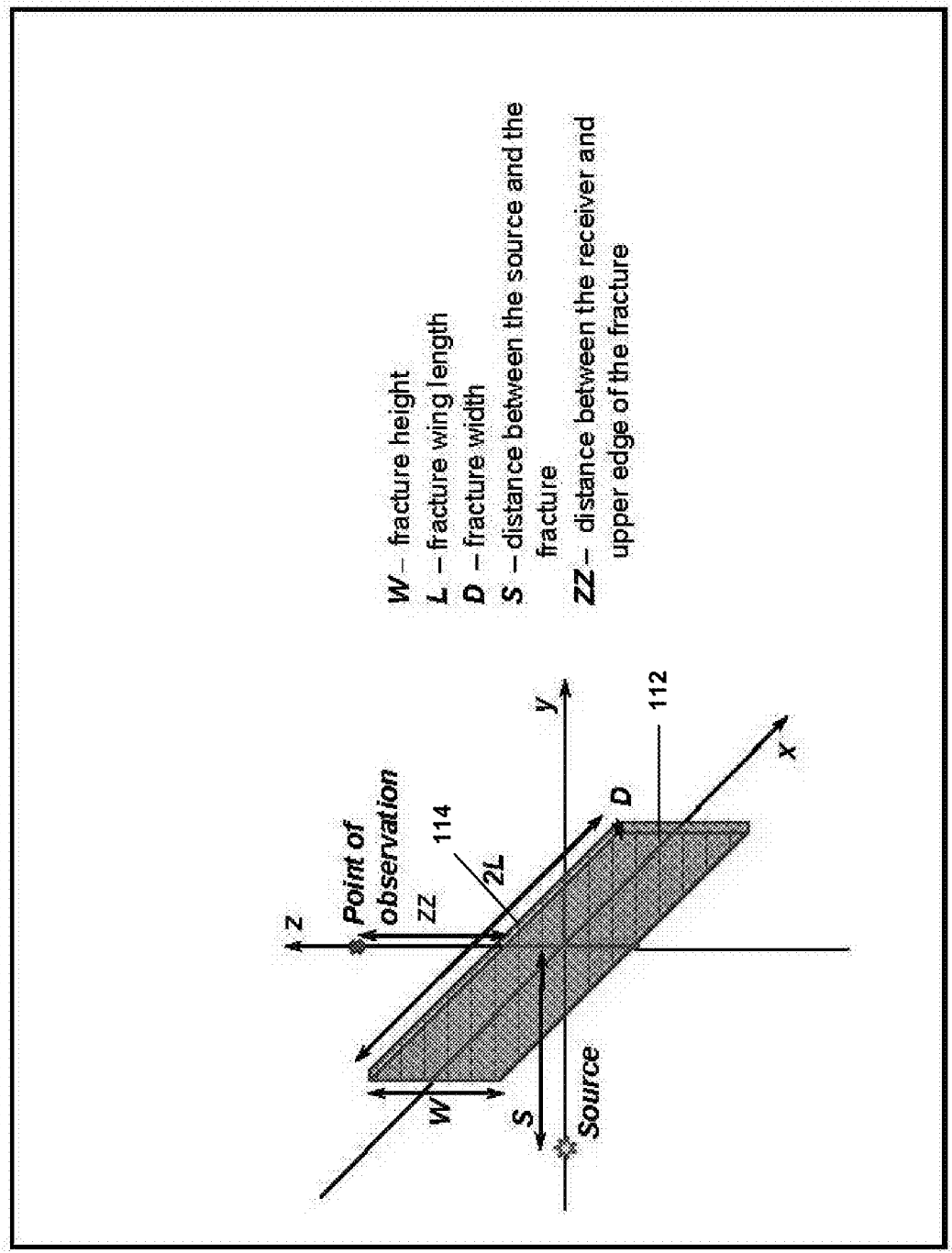
FIG. 2 illustrates a model of basic fracture geometry.

Turning now to FIG. 2, a graphical depiction of a mathematical model of fracture 112 is shown. Model parameters L, D, and W are the rectangular fracture wing length (L), height (D) and width (W), respectively, of fracture 112. It should be noted that a typical fracture 112 will not generally be a perfectly rectangular body as illustrated in FIG. 2. However, for the purposes of mathematical modeling, it is appropriate to model fracture 112 as a rectangular body. The point source, of direct or low frequency current, is preferably located on the y axis. S stands for the distance between the current source and fracture 112. Points of measurement of the vertical component of the electrical field and the components of the magnetic field are located along the z axis. ZZ stands for the distance between the receiver and the upper edge of fracture 112. As discussed above and illustrated in FIG. 1C, particulates of soft magnetic material with high magnetic permeability generate both electric and magnetic fields when energized. Thus, the fracturing fluid containing conducting fluid, proppant and particulates of soft magnetic material with magnetic permeability generates both electric and magnetic fields when energized.

For purposes of modeling, it is also assumed that fracture 112 is a zone of substantially constant resistivity. To simplify the model, the wellbore 106 and casing 102 are not seen in FIG. 2. Vertical fracture edge 114 of fracture 112 is also of interest because it has been observed that induced electric charges appear near vertical fracture edges 114 as fracture 112 is propagating during the fracturing process. These electric charges cause an anomaly, in the form of a field, which can be detected by sensors. Thus, when a geological medium, such as a fracture, is energized with electric current, induced electric charges appear at boundaries of different resistivity. Thus, when fracture 112 contains a fracture fluid with a resistivity different than formation 116 and the fracture 112 is energized using current source 115, the value of the electric charges, and the electric field, will depend on how the fracture is propagating.

As discussed above, during hydraulic fracturing, the injected hydraulic fracturing fluid contains proppant 111. Typically, this proppant is a sand or a ceramic proppant and has a typical diameter of 200-400 microns. Of course, proppant of a larger or smaller diameter could be used and this diameter is given only for purposes of example.

Equation 1 illustrates that the resistivity of the fracture can be estimated using the Archie equation.

$$\rho_{fracture} = \rho_w \varphi^{-m} \qquad \text{Eqn. 1}$$

In equation 1, $\varphi$ (0.6-0.8) is the liquid fraction in the injected hydraulic fracturing fluid, m is the Archie exponent (1.4-2), and $\rho_w$ is the resistivity of the injected water.

The injected fracturing fluid resistivity $\rho_w$ can be calculated using Equation 2:

$$\rho_w = 0.0123 + \frac{3647.5}{[NaCl(ppm)]^{0.955}} \left( \frac{41.5}{T + 21.5} \right) \qquad \text{Eqn. 2}$$

In equation 2, [NaCl (ppm)] is the salt concentration in the injected hydraulic fracturing fluid and T is the temperature in Celsius.

Figure 3:
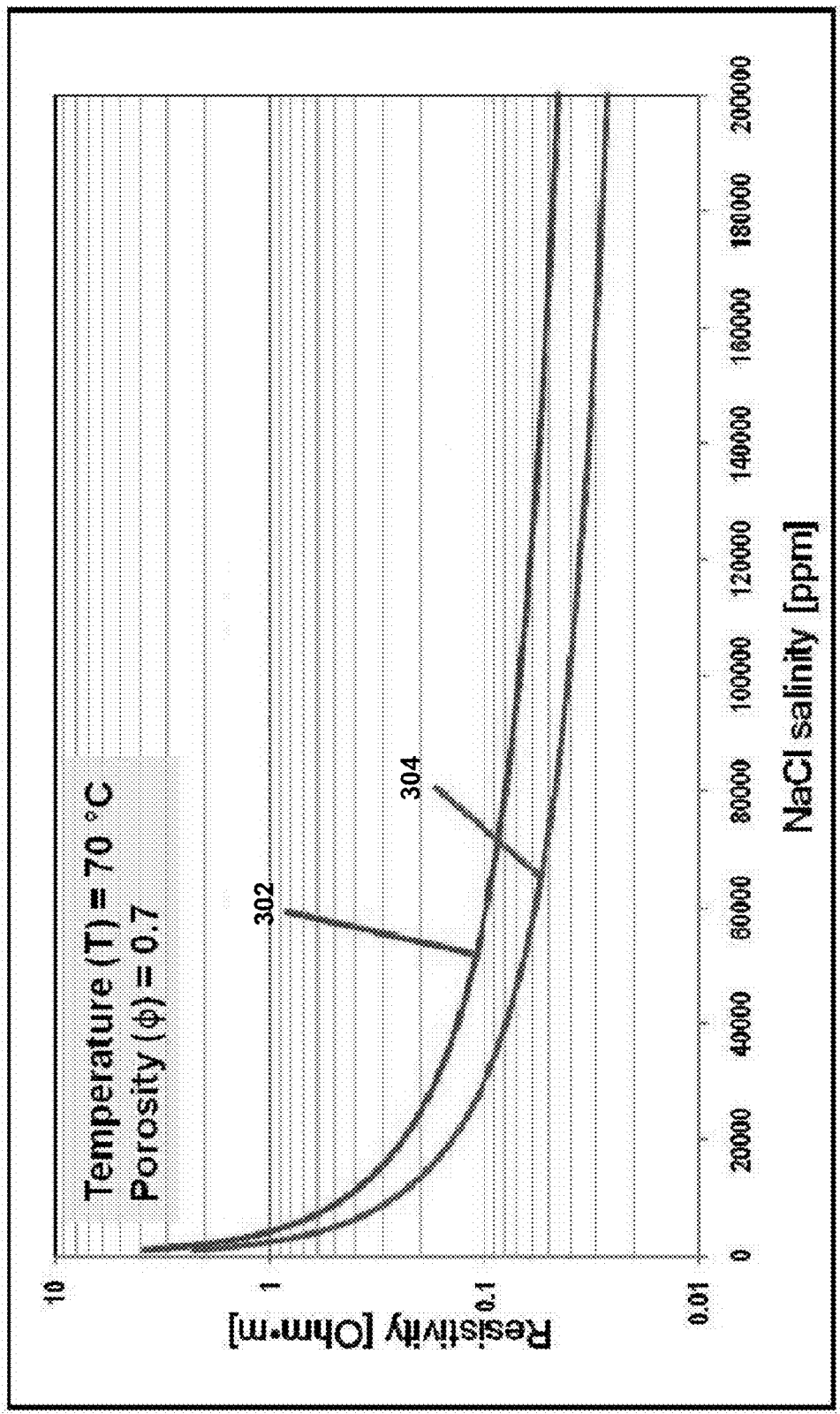
FIG. 3 is a graph of the dependence of injected hydraulic fracturing fluid and fracture space resistivity on the water salinity. The curves illustrate the fracture space resistivity and the injected fluid resistivity.

FIG. 3 illustrates how the resistivity of the injected hydraulic fracturing fluid and of fracture 112 depends on water salinity for a liquid fraction of 0.7 and a fluid temperature of 70 degrees C. FIG. 3 compares fracture space resistivity curve 302 to injected fluid resistivity curve 304. As can be seen in the Figure, for these conditions, resistivity decreases as the salt concentration, in this example the NaCl salinity, of the injected fluid increases. As discussed above, the injected fluid resistivity is the resistivity of the fluid, typically water, which is mixed with proppants to prepare a fracturing fluid. When the fracture 112 is filled with injected fracturing fluid, the fracture space resistivity refers to curve 302.

The electrical properties of the formation can be estimated using the Archie Equation, equation 3.

$$\rho_{formation} = \rho_{brine} \varphi^{-m} S_w^{-n} \qquad \text{Eqn. 3}$$

In equation 3, $\rho_{formation}$ is the formation resistivity, $\rho_{brine}$ is the formation brine resistivity, $S_w$ is the formation water saturation, and n and m are the Archie exponents.

Table 1, reproduced immediately below, illustrates the electrical properties of the formation under the conditions given in the table.

TABLE 1

Electrical properties of formation (for n = 2 and m = 3)

|  | Sandstone | | Shale | | Limestone | |
| --- | --- | --- | --- | --- | --- | --- |
| Porosity, % | 10 | 25 | 8 | 12 | 8 | 10 |
| Water saturation, % | 25 | 100 | 25 | 100 | 25 | 100 |
| Resistivity, Ohm · m (20 g/l brine) | 400-500 | 20-30 | 100-200 | 1-2 | >600 | 40-50 |
| Resistivity, Ohm · m (40 g/l brine) | 200-300 | 10-20 | 50-100 | ~1 | >400 | 20-30 |

Based on the information found in FIG. 3 and Table 1, it has been observed that the ratio of the resistivity of the formation to the resistivity of the fracture is high.

For example, as seen in Table 1, for a sandstone formation, the ratio of resistivity of the formation to the resistivity of the fracture is $$\frac{\rho_{formation}}{\rho_{fracture}}.$$

As also discussed above, the value of the charge density depends on the resistivity contrast. However, when the resistivity contrast is high, for example about 100 or more, the dependence on the contrast becomes negligible. Thus, a high resistivity contrast is favorable for application of a direct or low frequency current to energize fracture 112. As discussed above, when a geological medium is energized with electric current, an induced electric current appears at the boundaries of regions with different, also known as contrasting, resistivity.

It may appear that proppant 111 in the hydraulic fracturing fluid may be more readily magnetized by adding a soft magnetic material with a high magnetic permeability. Examples of appropriate soft magnetic solid compact materials are described in FIG. 4. If the soft magnetic material is insufficiently resilient to withstand a high load, a ceramic shell may be used to coat the soft magnetic material.

As illustrated in FIG. 4, in accordance with some embodiments of the invention, a preferred soft magnetic material with high magnetic permeability is FINEMET® FT-3L. However, when soft magnetic materials are crushed and exposed to the Earth's magnetic field, the particles of magnetic material polarize separately. As a result of the polarization, demagnetization of the particles takes place. This demagnetization dramatically reduces the magnetic permeability of the magnetic powder compared to its solid compact state. For example, as seen in FIG. 4, FINEMET® FT-3L has a magnetic permeability of 50,000 at a frequency of 1 KHz in its solid compact state. Applicants conducted a physical experiment to determine the value the magnetic permeability of a Russian analog of powder FINEMET® FT-3L. Applicants' physical experiment found that the magnetic permeability of the Russian analog of FINEMET® FT-3L was reduced from 50,000 to 13.4 when it was crushed and turned into a powder in a fracture element with a fracture height (W) of 6 centimeters, a length (L) of 60 centimeters and a fracture width (D.) It should be understood that the magnetized proppant is injected into fracture 112 and that, preferably, fracture 112 is substantially filled with magnetized proppant.

Equation 5 calculates the sensitivity $\eta_L$ of the measured signal.

$$\eta_L = \frac{\partial \ln E_z}{\partial \ln L} \qquad \text{Eqn. 5}$$

Figure 5:
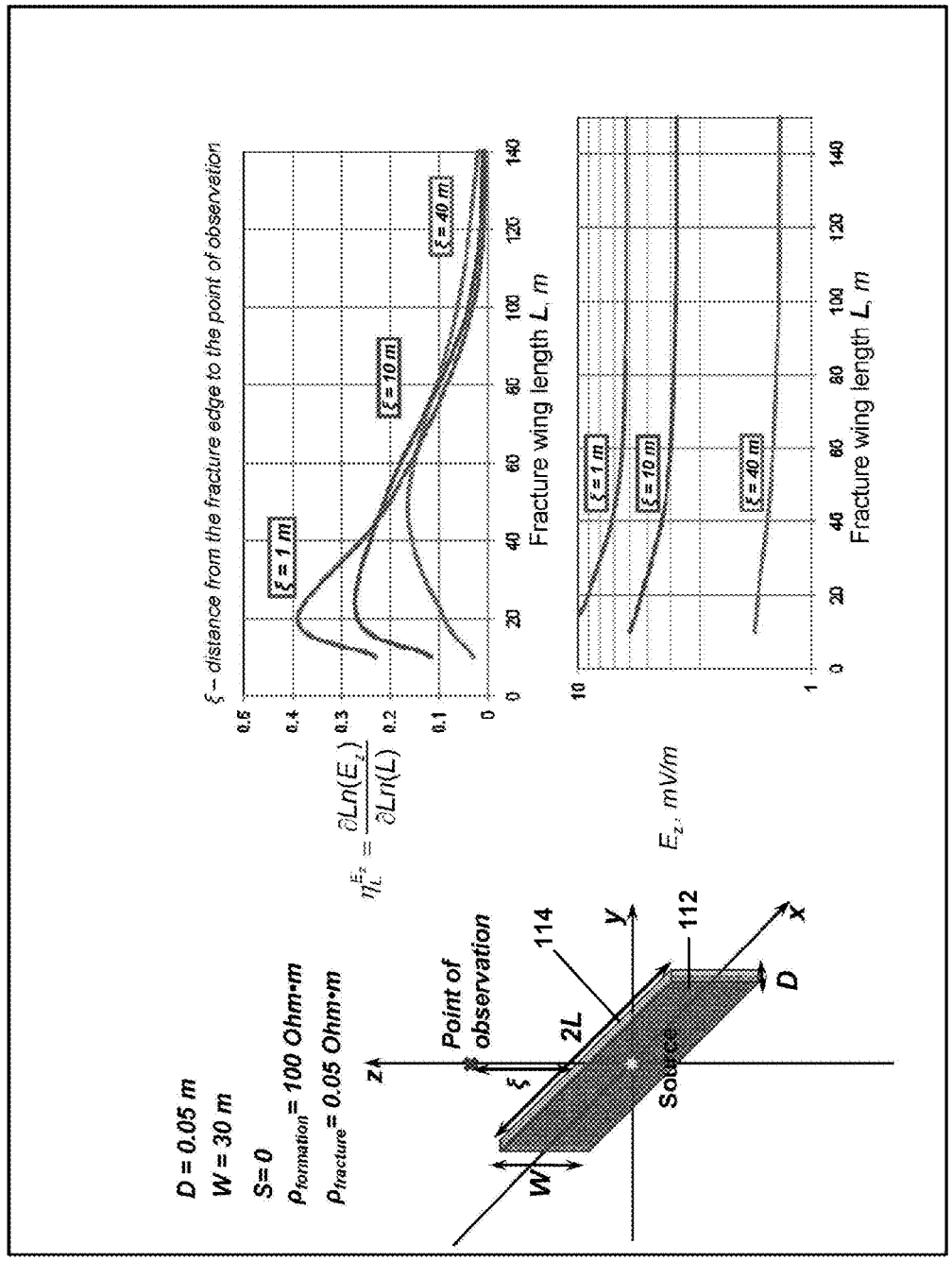
FIG. 5 illustrates the sensitivity function of the measured signal and also the measured signal compared along the length of a fracture where the current electrode is embedded in the fracture.

In equation 5, $E_z$ is the measured signal and L is fracture wing length. FIG. 5 compares the sensitivity function of Equation 5 using the measured signal to fracture wing length where the current electrode is embedded in the fracture-thus, S=0 meters. As shown in FIG. 5, the distance of observation $\xi$, is the distance from the fracture edge 114 to the point of observation. FIG. 5 also illustrates measured signal $E_z$.

Figure 6:
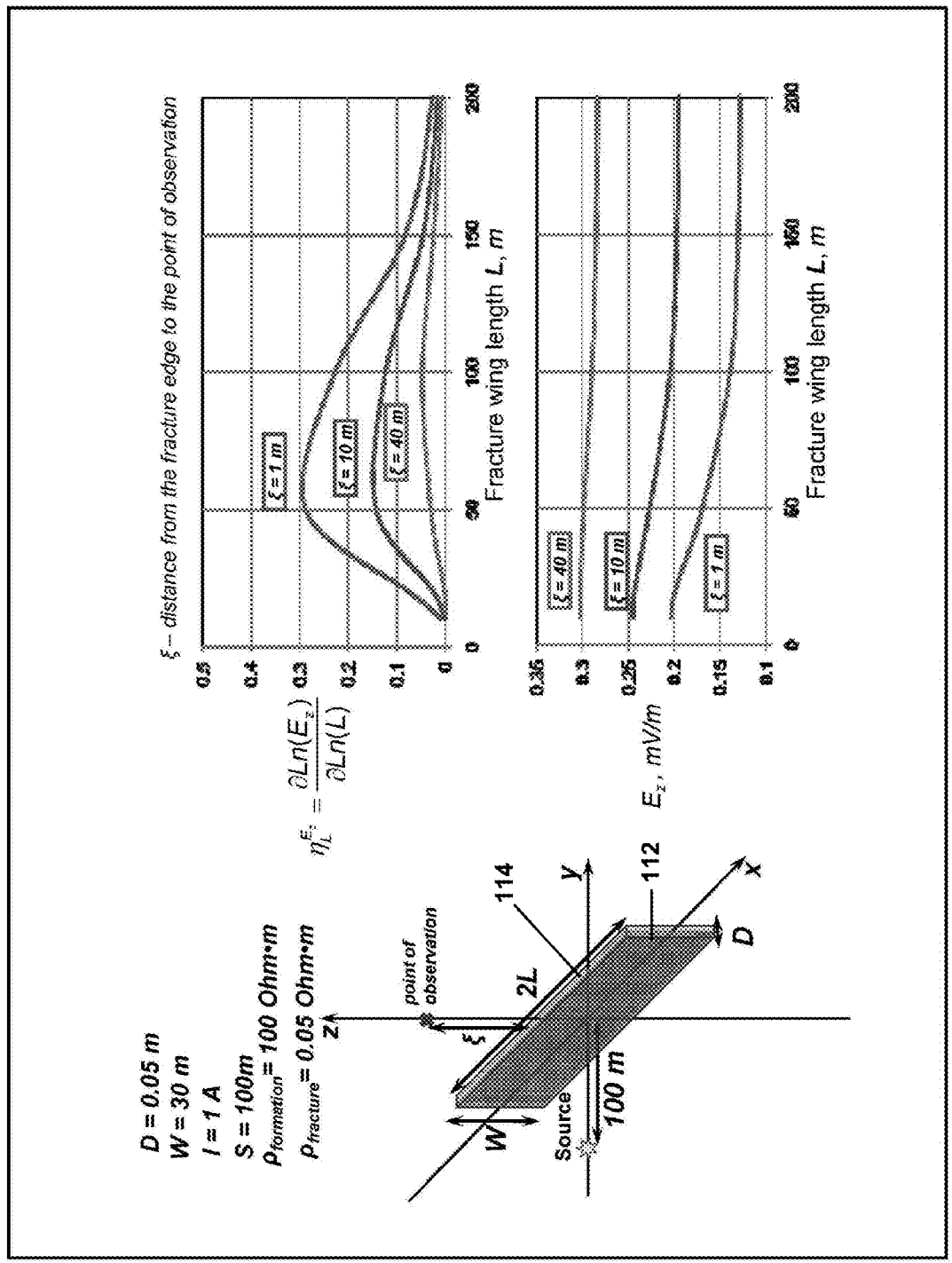
FIG. 6 illustrates the sensitivity function of the measured signal and also the measured signal compared along the length of the fracture where the current electrode is positioned 100 meters from the fracture.

FIG. 6 compares the sensitivity function of Equation 5 using the measured signal $E_z$ to fracture wing length L where the current electrode is located 100 meters from the fracture-thus, S=100 meters. As shown in FIG. 6, the distance of observation $\xi$, is the distance from the fracture edge 114 to the point of observation. FIG. 6 also illustrates measured signal $E_z$.

Figure 7:
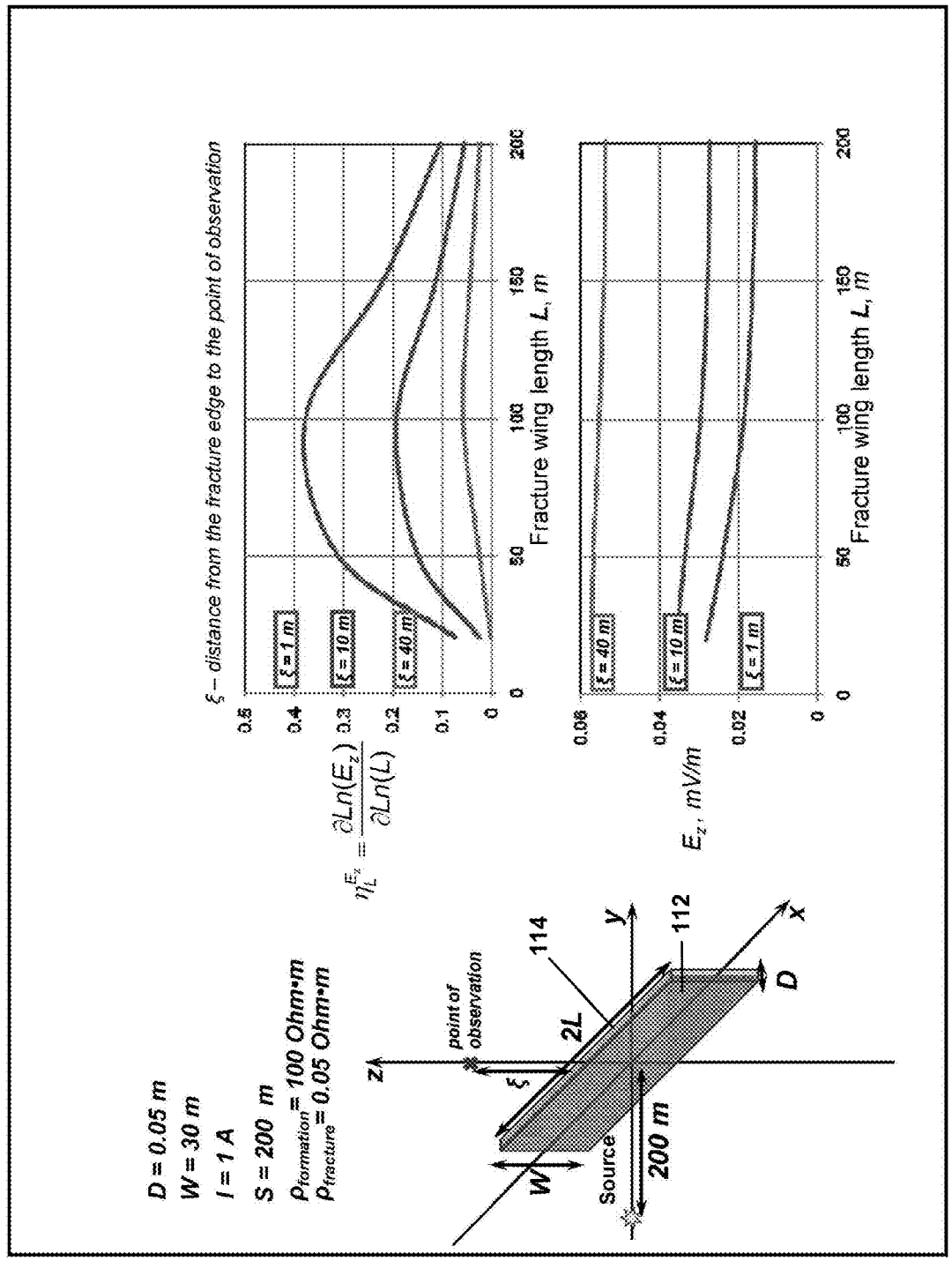
FIG. 7 illustrates the sensitivity function of the measured signal and also the measured signal compared along the length of the fracture where the current electrode is positioned 200 meters from the fracture.

FIG. 7 compares the sensitivity function of Equation 5 using the measured signal $E_z$ to fracture wing length L where the current electrode is located 200 meters from the fracture-thus, S=200 meters. As shown in FIG. 7, the distance of observation $\xi$, is the distance from the fracture edge 114 to the point of observation. FIG. 7 also illustrates measured signal $E_z$.

The results of the mathematical modeling seen in FIGS. 5, 6 and 7 are collected in Table 2 below. The electrical field $E_z$, shown in Table 2 corresponds to an injected current of 1 ampere (1 A). Parameter $L_{max}$ stands for the value of L at which the sensitivity function $\eta_L$ is at its maximum.

TABLE 2

| S, m | $\xi$, m | $L_{max}$, m | $\eta_{L_{max}}^{E_z}$ | $E_z(L_{max})$, mV/m |
|---|---|---|---|---|
| 0 | 1 | 20 | 0.38 | 9.0 |
|  | 10 | 25 | 0.27 | 5.0 |
|  | 40 | 50 | 0.16 | 1.5 |
| 100 | 1 | 60 | 0.3 | 0.3 |
|  | 10 | 60 | 0.15 | 0.2 |
|  | 40 | 100 | 0.03 | 0.14 |
| 200 | 1 | 85 | 0.38 | 0.03 |
|  | 10 | 90 | 0.2 | 0.03 |
|  | 40 | 100 | 0.05 | 0.02 |

In accordance with some embodiments of the invention, in order to obtain optimal measurement conditions when tracking fracture growth as the fracture grows from zero meters to 200 meters, sensor placement may be optimized if the electrical field $E_z$ is measured at the point $\xi=1$ meter. Furthermore, in accordance with some embodiments for optimal measurement, current sources may be embedded in the fracture (S=0), at 100 meters (S=100), and also at 200 meters (S=200) and that these sources be operated sequentially. This sequential operation (activation) of current sources in order of their positions relative to the fracture may be referred to as activation according to a spatial sequence of their positions.

If optimal conditions, as described above hold true, then based on the Applicants' experimentation, the minimal value of the measured signal is about 0.02 mV/m if an electric dipole of 10 meters is used to measure $E_z$. Thus, the potential difference is about 200 μV for an injected current of 1 Ampere (1 A) if an electric dipole of 10 meters is used to measure $E_z$. Applicants' experimentation also found that when the sensitivity function $\eta_L^{E_z}$ is greater than 0.3, the accuracy of the evaluation of L is about 3% and for the accuracy of the electric field $\eta_L^{E_z}$, about 1%. This is determined from the definition of the sensitivity function:

$$\eta_L^E = \frac{\partial \ln E_z}{\partial \ln L} = \lim_{\Delta E_z \Delta \to 0} \frac{\frac{\Delta E_Z}{E_Z}}{\frac{\Delta L}{L}} = \frac{\text{relative increment of } E_Z}{\text{relative increment of } L}.$$

This ratio can be treated as $$\frac{\text{relative error of } E_Z, \%}{\text{relative error of } L, \%}.$$

If $\eta_L^{E_z}=0.3$ and $\delta E_z=1\%$, then $$0.3 = \frac{1\%}{\delta L, \%}.$$

Thus, $$\delta L = \frac{1\%}{0.3} = 3.3\%.$$

Electrical field anomalies arise near the vertical fracture edge 114 as the fracture 112 grows if a current is injected into the fracture. These anomalies can be measured by the wellbore 106 array of sensors. In some embodiments, an electrode array can be used as a set of sensors. An example of an electrode array is a configuration of electrodes used for measuring an electric current or a voltage.

Geophysical methods for imaging geological structures and evaluation of hydraulic fracture geometry include different acquisition schemes such as surface, borehole (single-hole), borehole (cross-hole), and surface-to-borehole. Imaging of the structures and parameters of the fractures geometry are obtained by the processing and inversion of geophysical anomalies coming from different sources. Thus, imaging of the structures and parameters may occur by using (a) anomalies of the magnetic field arising when geological structures and fractures are filled with magnetic materials; or (b) anomalies of the electric field related to low frequency current used for energizing the structure/fracture. A conventional interpretation of the results of the inversion can be non-unique.

Time-lapse measurements of the electric and magnetic field are performed during the whole fracturing process. The changes in the electric and magnetic fields coming from the propagating fracture are acquired in fracturing or/and observation wells with electrode arrays and magnetometers correspondingly.

The time-lapse measurements may be inverted jointly or separately for fracture geometry using special algorithms based on computer simulations of the fracturing process. The results of this inversion can be used for run-time control of the hydrofracturing process.

Figure 8:
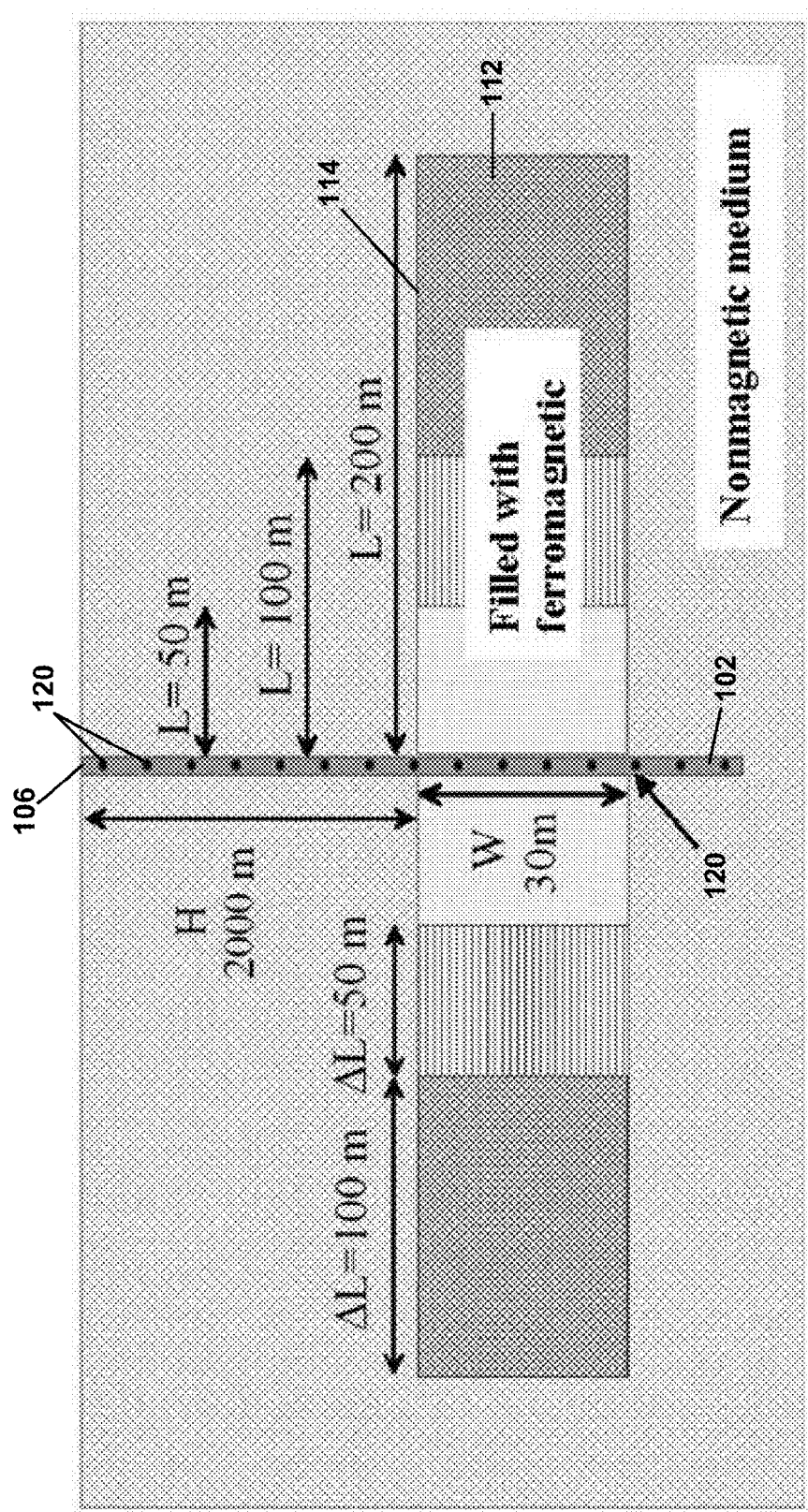
FIG. 8 illustrates a model used for modeling magnetic measurements in a wellbore.

FIG. 8 illustrates an exemplary model of magnetic measurements in the wellbore 106 while fracturing. In this example, sensors 120 are preferably positioned at one meter intervals along wellbore 106.

Figure 9B:
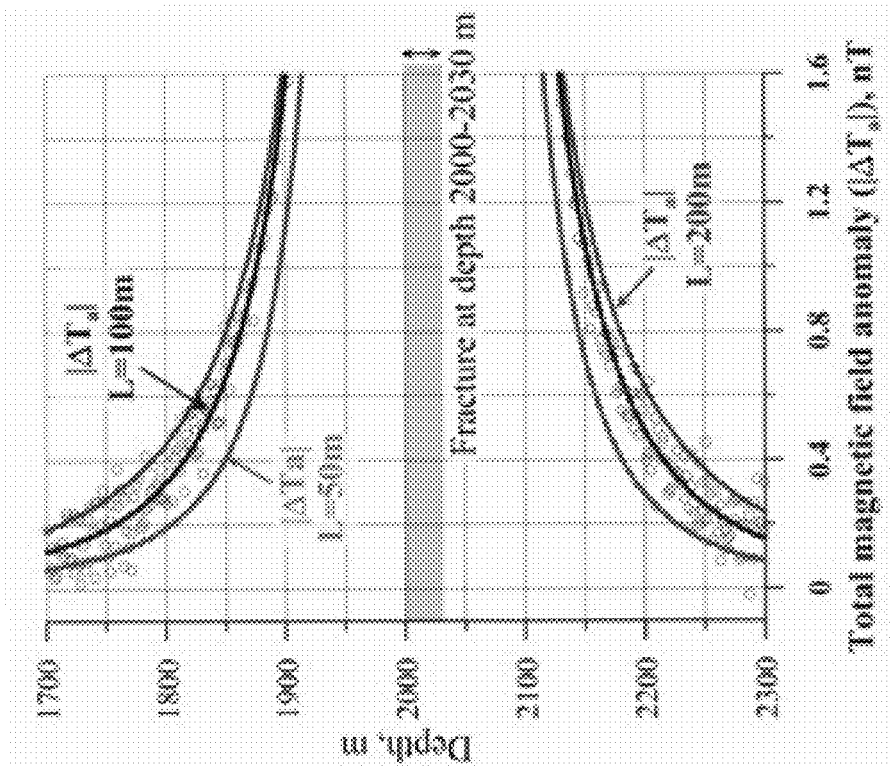
FIG. 9B is a graph illustrating an exemplary comparison of modeled (theoretical) magnetic field data to measured magnetic field data for various fracture wing lengths.
Figure 9A:
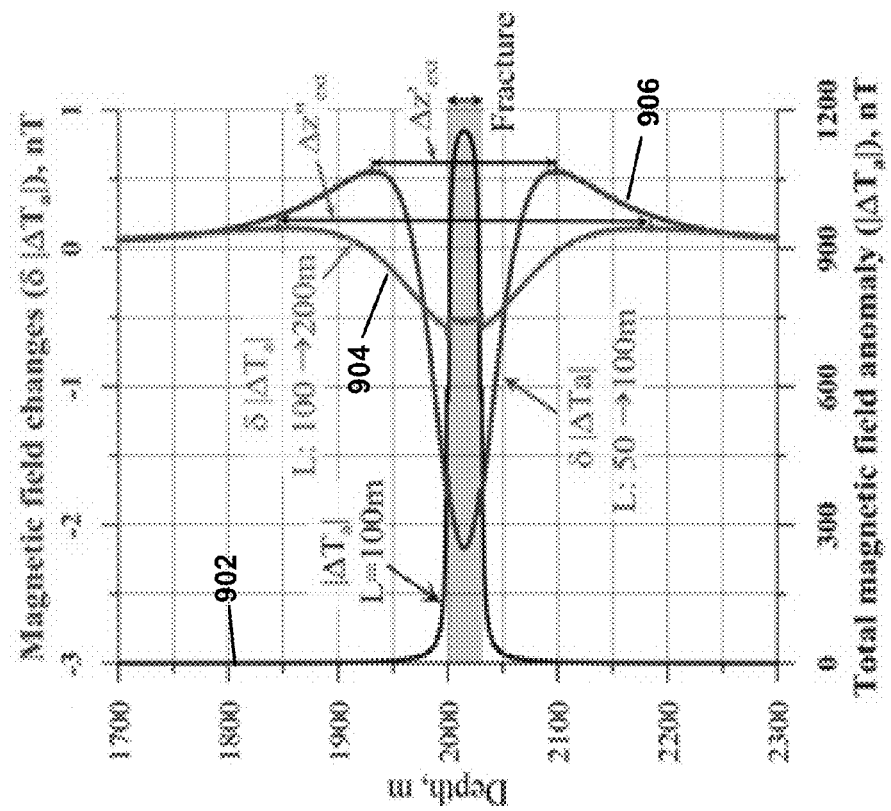
FIG. 9A is a graph illustrating the sensitivity of magnetic measurements to fracture wing length.

FIG. 9A graphically illustrates the total magnetic field anomaly for a fracture wing length of 100 meters [curve 902], the length of 50 meters to 100 meters [curve 906], and 100 meters to 200 meters [curve 904]. A magnetized proppant with a true permeability $\mu_{powder}$ of 13.4, such as FINEMET®, generates a magnetic anomaly of 1000 nT (nanoTeslas). As fracture L begins to grow from 50 meters to 200 meters, a magnetic anomaly change of about 0.5 nT occurs. A conventional magnetometer can be used to detect these magnetic anomalies. Thus, FIG. 9A illustrates that magnetic field variations of about 0.5 nT (nanoTeslas) can be stably detected by a multisensory tool, such as a magnetometer. A magnetic field variation of about 0.5 nT (nanoTeslas) can also reliably determine the depth of the fracture 112—that is, how far below the surface of the earth that the fracture is occurring. FIG. 9A illustrates that the fracture depth is 2000 meters to 2030 meters. Thus, as illustrated in FIGS. 8 and 9A the height W of the fracture is 30 meters.

In accordance with some embodiments of the invention, FIGS. 8 and 9B illustrate that magnetometers in sensors 120 are located in wellbore 106. Magnetometers detect the magnetic field generated by magnetized proppant located in fracture 112. FIG. 9B illustrates that this data can be used to determine fracture length L.

Turning now to FIG. 10, a flow chart for a method of estimating fracture wing length 200 is shown. At 210, apparatus for the measurement of electric and magnetic field is placed in the wellbore. At 220, time-lapsed measurements of the electric and magnetic fields in the wellbore are taken. The measurements are taken before, during and after fracturing. At 230, the electric and magnetic field measurements are processed to estimate fracture length.

Figure 11:
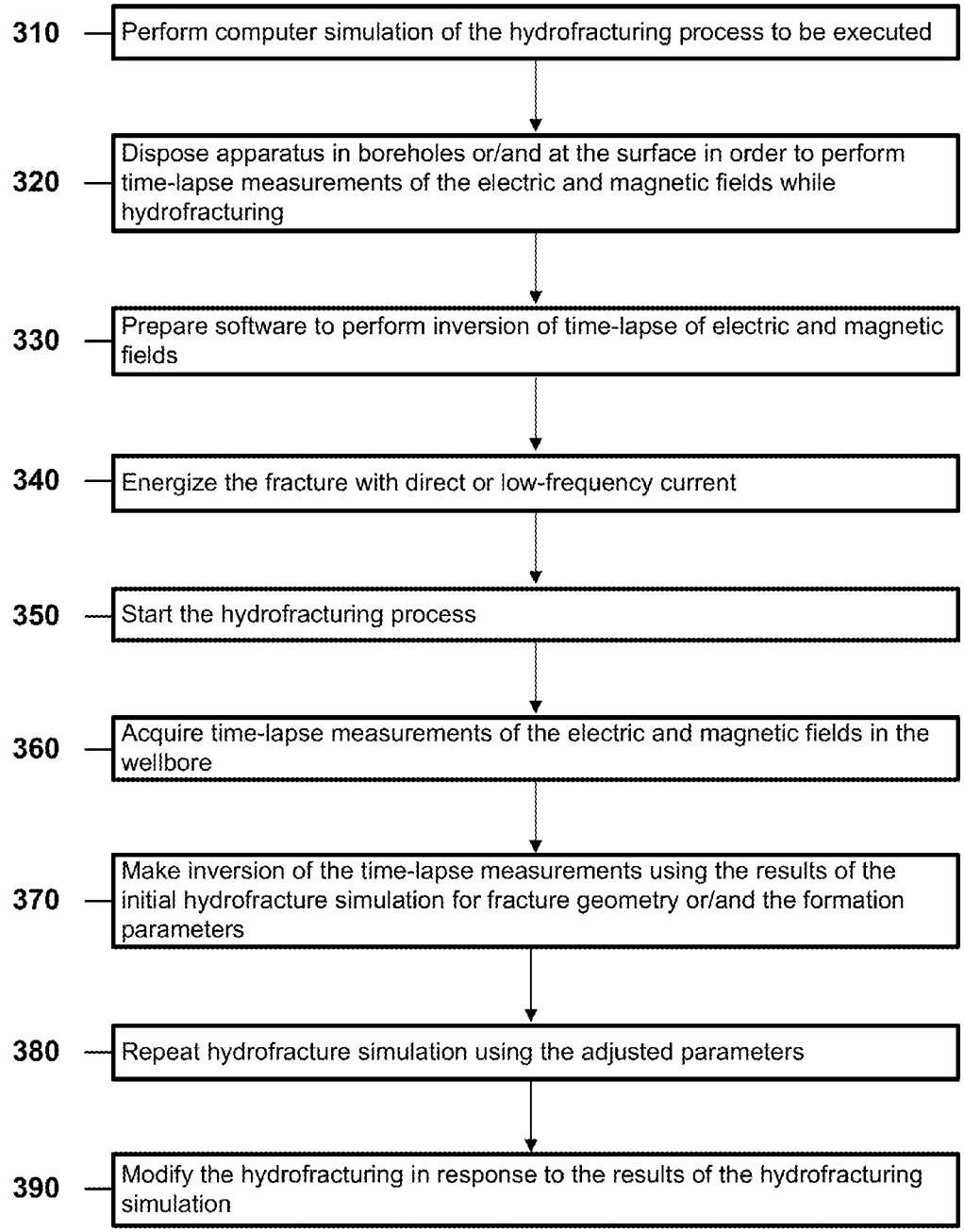
FIG. 11 is a flow chart of an alternative embodiment of a method of estimating fracture wing length.

Turning now to FIG. 11, a flow chart for an alternative method of estimating fracture wing length 300 is shown. At 310, a computer simulation of the hydrofracturing process is performed. At 320, apparatus for the measurement of electric and magnetic fields is placed. This apparatus can be positioned at surface or in the wellbore. At 330, the software is prepared to perform an inversion of time-lapse measurements of the electric and magnetic fields in the wellbore. At 340, the fracture is energized. Preferably, the fracture is energized with a direct or low-frequency current. At 350, the hydrofracturing process is started. At 360, time-lapse measurements of the electric and magnetic fields in the wellbore are acquired. As discussed above, these measurements can be taken by measurement apparatus located at the surface or below the surface or even positioned within the wellbore. At 370, make an inversion of the time-lapsed measurements using the results of the earlier hydrofracture simulation. This inversion should provide fracture geometry and parameters. At 380, repeat the hydrofracturing simulation using the adjusted parameters. At 390, modify the hydrofracturing in response to the results of the hydrofracturing simulation. Thus, this method can provide a better understanding of the progress of the hydrofracturing process and the geometry of the fracture and, if the hydrofracturing process is not proceeding as desired, the process can be modified to obtain or at least more closely approach, the desired fracture geometry.

In light of the principles and example embodiments described and illustrated herein, it will be recognized that the example embodiments can be modified in arrangement and detail without departing from such principles. Also, the foregoing discussion has focused on particular embodiments, but other configurations are also contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments. As a rule, any embodiment referenced herein is freely combinable with any one or more of the other embodiments referenced herein, and any number of features of different embodiments is combinable with one another, unless indicated otherwise.

Similarly, although example processes have been described with regard to particular operations performed in a particular sequence, numerous modifications could be applied to those processes to derive numerous alternative embodiments of the present invention. For example, alternative embodiments may include processes that use fewer than all of the disclosed operations, processes that use additional operations, and processes in which the individual operations disclosed herein are combined, subdivided, rearranged, or otherwise altered.

This disclosure may include descriptions of various benefits and advantages that may be provided by various embodiments. One, some, all, or different benefits or advantages may be provided by different embodiments.

In view of the wide variety of useful permutations that may be readily derived from the example embodiments described herein, this detailed description is intended to be illustrative only, and should not be taken as limiting the scope of the invention. What is claimed as the invention, therefore, are all implementations that come within the scope of the following claims, and all equivalents to such implementations.

What is claimed is:

1. A method of hydraulic fracturing geometry evaluation, comprising:
    injecting a fracturing fluid comprising a magnetic material into a subsurface fracture;
    energizing the subsurface fracture by sequential activation of one or more electric current sources disposed at different subsurface positions, including at least one position in the subsurface fracture and other positions located at different distances from the subsurface fracture, wherein the sequential activation comprises activation according to a spatial sequence of the different subsurface positions;
    measuring an electric field induced by the energizing of the subsurface fracture;
    measuring a magnetic field generated by the magnetic material in the subsurface fracture; and
    modeling, based on the measuring, a geometry of the fracture.

2. The method of claim 1, further comprising monitoring the amount of magnetic material in the fracturing fluid during fracturing, and adjusting the amount of magnetic material based on the monitoring.

3. The method of claim 1, further comprising injecting a conductive fluid into the fracturing fluid.

4. The method of claim 1, wherein measuring at least one of (a) the magnetic field and (b) the electric field comprises measuring the field within a wellbore.

5. The method of claim 1, wherein measuring at least one of (a) the magnetic field and (b) the electric field comprises measuring the field at the earth's surface.

6. The method of claim 1, further comprising changing the rate at which the fracturing fluid is injected in the fracture based on the modeled geometry of the fracture.

7. The method of claim 1, wherein the magnetic material comprises a powder.

8. An apparatus for hydraulic fracturing geometry evaluation, comprising:
    at least one electric current source configured for energizing a subsurface fracture by sequential activation of each at least one electric current source, the at least one electric current source disposed at different subsurface positions, including at least one position in the subsurface fracture and other positions located at different distances from the subsurface fracture, wherein the sequential activation comprises activation according to a spatial sequence of the different subsurface positions;
    means for providing measurement of an electric field induced by the energizing of the subsurface fracture;
    means for providing measurement of a magnetic field generated by a magnetic material of a fracturing fluid, the fracturing fluid having been injected into the subsurface fracture; and
    means for modeling, based on the measurements, a geometry of the fracture.

9. The apparatus of claim 8, wherein the means for modeling calculates a length, a width and a depth of the subsurface fracture.

10. The apparatus of claim 8, wherein the means for modeling calculates an optimal position of at least one of (a) the means for providing measurement of the electric field, and (b) the means for providing measurement of the magnetic field.

11. The apparatus of claim 8, wherein the means for modeling calculates the sensitivity of at least one of (a) the electric field measurement and (b) the magnetic field measurement, at the different distances from the subsurface fracture.

12. The apparatus of claim 8, wherein at least one of (a) the means for providing measurement of the electric field and (b) the means for providing measurement of the magnetic field detects the respective field at the different distances from the subsurface fracture.

13. An apparatus for hydraulic fracturing geometry evaluation, comprising:
    at least one processor;
    a memory coupled to the at least one processor, the memory comprising executable instructions that, when executed, cause the at least one processor to:
    receive measurements of a magnetic field generated by a magnetic material of a fracturing fluid in a subsurface fracture;
    receive measurements of an electric field induced by energizing the subsurface fracture by sequential activation of at least one electric current source disposed at different subsurface positions, including at least one position in the subsurface fracture and other positions located at different distances from the subsurface fracture, wherein the sequential activation comprises activation according to a spatial sequence of the different subsurface positions; and
    model a geometry of the subsurface fracture based on the measurements.

14. The apparatus of claim 13, wherein the at least one processor determines a length, a width and a depth of the subsurface fracture.

15. The apparatus of claim 13, wherein the at least one processor determines optimal positions for one or more sensors, wherein the sensors are configured to receive measurements of the magnetic field generated by the magnetic material of the fracturing fluid or measurements of the electric field induced by energizing the subsurface fracture.

16. The apparatus of claim 13, wherein the at least one processor determines the sensitivity of at least one of (a) the electric field measurements and (b) magnetic field measurements, at the different distances from the subsurface fracture.

17. The apparatus of claim 13, further comprising one or more sensors that detect at least one of (a) the magnetic field and (b) the electric field.

* * * * *